US011177201B2

(12) United States Patent
Chen et al.

(10) Patent No.: US 11,177,201 B2
(45) Date of Patent: Nov. 16, 2021

(54) SEMICONDUCTOR PACKAGES INCLUDING ROUTING DIES AND METHODS OF FORMING SAME

(71) Applicant: Taiwan Semiconductor Manufacturing Company, Ltd.

(72) Inventors: Jie Chen, New Taipei (TW); Ying-Ju Chen, Tuku Township (TW); Hsien-Wei Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 81 days.

(21) Appl. No.: 15/877,123

(22) Filed: Jan. 22, 2018

(65) Prior Publication Data

US 2019/0148276 A1    May 16, 2019

Related U.S. Application Data

(60) Provisional application No. 62/586,509, filed on Nov. 15, 2017.

(51) Int. Cl.
*H01L 21/56* (2006.01)
*H01L 21/768* (2006.01)
(Continued)

(52) U.S. Cl.
CPC ...... *H01L 23/49822* (2013.01); *H01L 21/486* (2013.01); *H01L 21/4853* (2013.01);
(Continued)

(58) Field of Classification Search
CPC ............... H01L 21/4853; H01L 21/486; H01L 23/3114; H01L 23/49822; H01L 23/5226;
(Continued)

(56) References Cited

U.S. PATENT DOCUMENTS 9,000,584 B2    4/2015  Lin et al.
9,048,222 B2    6/2015  Hung et al.
(Continued)

FOREIGN PATENT DOCUMENTS

CN    106571356 A    4/2017
CN    107342267 A    11/2017
KR    20150059635 A    6/2015

*Primary Examiner* — Eduardo A Rodela
*Assistant Examiner* — Christopher M Roland
(74) *Attorney, Agent, or Firm* — Slater Matsil, LLP

(57) ABSTRACT

In an embodiment, a package includes a first package structure including a first integrated circuit die having an active side and a back-side, the active side including die connectors, a second integrated circuit die adjacent the first integrated circuit die, the second integrated circuit die having an active side and a back-side, the active side including die connectors, a routing die including die connectors bonded to the active sides of the first integrated circuit die and the second integrated circuit die, the routing die electrically coupling the first integrated circuit die to the second integrated circuit die, an encapsulant encapsulating the first integrated circuit die, the second integrated circuit die, and the routing die, and a first redistribution structure on and electrically connected to the die connectors of the first integrated circuit die and the second integrated circuit die.

20 Claims, 20 Drawing Sheets

(51) Int. Cl.
*H01L 21/82* (2006.01)
*H01L 23/31* (2006.01)
*H01L 23/522* (2006.01)
*H01L 25/065* (2006.01)
*H01L 23/538* (2006.01)
*H01L 21/683* (2006.01)
*H01L 25/10* (2006.01)
*H01L 23/498* (2006.01)
*H01L 21/48* (2006.01)
*H01L 25/00* (2006.01)
*H01L 23/00* (2006.01)

(52) U.S. Cl.
CPC .......... *H01L 21/561* (2013.01); *H01L 21/563* (2013.01); *H01L 21/568* (2013.01); *H01L 21/6835* (2013.01); *H01L 21/76877* (2013.01); *H01L 21/76885* (2013.01); *H01L 21/82* (2013.01); *H01L 23/3114* (2013.01); *H01L 23/5226* (2013.01); *H01L 23/5389* (2013.01); *H01L 24/09* (2013.01); *H01L 24/17* (2013.01); *H01L 24/19* (2013.01); *H01L 24/81* (2013.01); *H01L 24/97* (2013.01); *H01L 25/0657* (2013.01); *H01L 25/105* (2013.01); *H01L 25/50* (2013.01); *H01L 23/3128* (2013.01); *H01L 2221/68345* (2013.01); *H01L 2221/68359* (2013.01); *H01L 2224/02331* (2013.01); *H01L 2224/0401* (2013.01); *H01L 2224/04105* (2013.01); *H01L 2224/08135* (2013.01); *H01L 2224/08145* (2013.01); *H01L 2224/08151* (2013.01); *H01L 2224/08225* (2013.01); *H01L 2224/08265* (2013.01); *H01L 2224/1146* (2013.01); *H01L 2224/12105* (2013.01); *H01L 2224/131* (2013.01); *H01L 2224/13082* (2013.01); *H01L 2224/13147* (2013.01); *H01L 2224/16145* (2013.01); *H01L 2224/16227* (2013.01); *H01L 2224/16265* (2013.01); *H01L 2224/24135* (2013.01); *H01L 2224/32135* (2013.01); *H01L 2224/32145* (2013.01); *H01L 2224/32225* (2013.01); *H01L 2224/40135* (2013.01); *H01L 2224/48091* (2013.01); *H01L 2224/48135* (2013.01); *H01L 2224/48227* (2013.01); *H01L 2224/73209* (2013.01); *H01L 2224/73253* (2013.01); *H01L 2224/73259* (2013.01); *H01L 2224/73265* (2013.01); *H01L 2224/73267* (2013.01); *H01L 2224/81005* (2013.01); *H01L 2224/8181* (2013.01); *H01L 2224/81815* (2013.01); *H01L 2224/92124* (2013.01); *H01L 2224/92224* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15192* (2013.01); *H01L 2924/15311* (2013.01); *H01L 2924/19011* (2013.01); *H01L 2924/19104* (2013.01)

(58) Field of Classification Search
CPC . H01L 25/0657; H01L 21/561; H01L 21/563; H01L 21/568; H01L 21/76877; H01L 21/82; H01L 23/3128; H01L 24/09; H01L 24/17; H01L 24/81; H01L 25/50; H01L 2224/02331; H01L 2224/08135; H01L 2224/08151; H01L 2224/24135; H01L 2224/32135; H01L 2224/40135; H01L 2224/48135
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,449,953 B1 | 9/2016 | Shih et al. | |
| 9,496,189 B2 | 11/2016 | Yu et al. | |
| 9,653,428 B1* | 5/2017 | Hiner | H01L 25/0655 |
| 9,761,559 B1* | 9/2017 | Shih | H01L 25/0652 |
| 9,837,359 B1* | 12/2017 | Chiu | H01L 21/565 |
| 2006/0226527 A1* | 10/2006 | Hatano | H01L 23/5389 |
| | | | 257/686 |
| 2007/0080442 A1* | 4/2007 | Meyer-Berg | H01L 25/0655 |
| | | | 257/686 |
| 2013/0001792 A1* | 1/2013 | Uno | H01L 23/49575 |
| | | | 257/773 |
| 2013/0062761 A1 | 3/2013 | Lin et al. | |
| 2015/0145142 A1 | 5/2015 | Lin et al. | |
| 2015/0171015 A1* | 6/2015 | Mahajan | H01L 23/5381 |
| | | | 257/712 |
| 2015/0243620 A1* | 8/2015 | Lin | H01L 24/14 |
| | | | 257/737 |
| 2015/0333039 A1* | 11/2015 | Liu | H01L 23/5381 |
| | | | 257/773 |
| 2015/0364422 A1 | 12/2015 | Zhai et al. | |
| 2016/0093571 A1 | 3/2016 | Kim et al. | |
| 2016/0133571 A1 | 5/2016 | Lee et al. | |
| 2017/0092604 A1* | 3/2017 | Hsieh | H01L 25/105 |
| 2017/0125379 A1 | 5/2017 | Chen et al. | |
| 2017/0170128 A1 | 6/2017 | Chen et al. | |
| 2017/0250138 A1 | 8/2017 | Hsieh et al. | |
| 2017/0271203 A1* | 9/2017 | Liu | H01L 24/19 |
| 2017/0317038 A1 | 11/2017 | Tsai et al. | |
| 2018/0040548 A1* | 2/2018 | Kim | H01L 21/6835 |
| 2018/0061767 A1* | 3/2018 | Chiang | H01L 23/49811 |
| 2019/0006264 A1* | 1/2019 | Vaidya | H01L 25/16 |
| 2019/0103379 A1* | 4/2019 | Yu | H01L 21/6835 |
| 2021/0035797 A1* | 2/2021 | Kuo | H01L 21/561 |
| 2021/0090993 A1* | 3/2021 | Yu | H01L 21/76804 |

* cited by examiner

SEMICONDUCTOR PACKAGES INCLUDING ROUTING DIES AND METHODS OF FORMING SAME

This application claims the benefit of U.S. Provisional Application No. 62/586,509, filed on Nov. 15, 2017, entitled "Semiconductor Packages and Methods of Forming Same," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
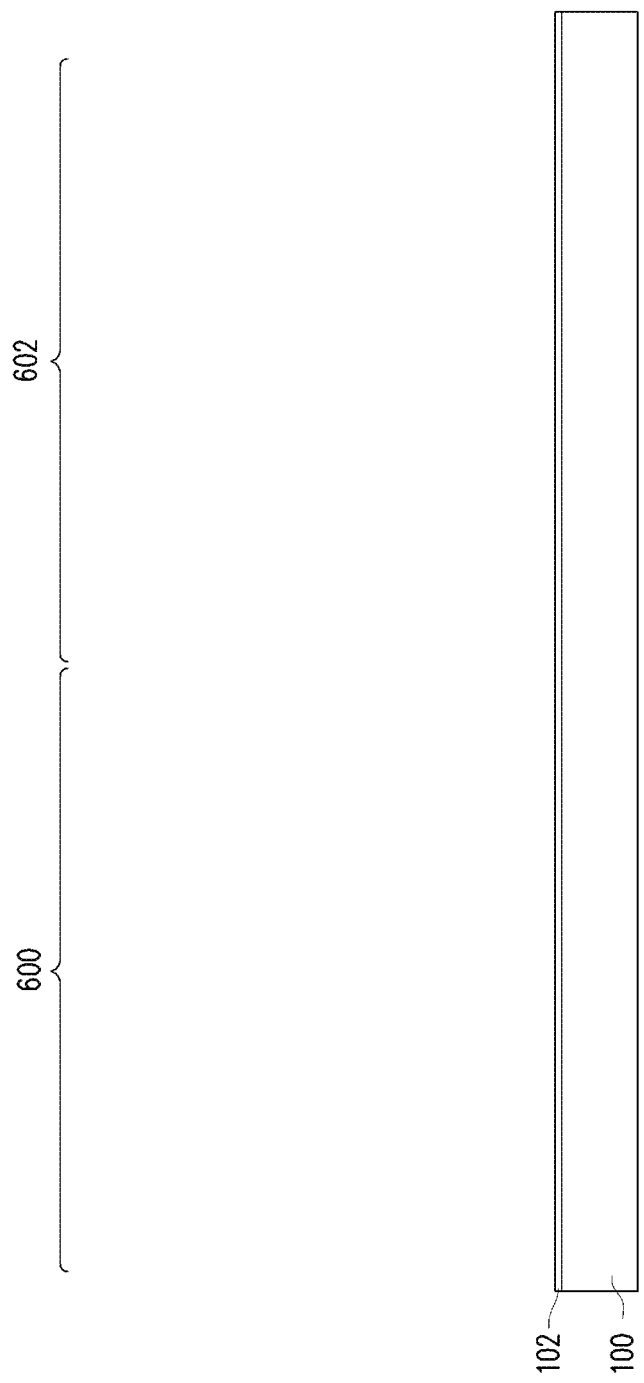
FIGS. 1 through 15 illustrate cross-sectional and plan views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including a routing die connecting one or more dies in the package structure. In some embodiments, the routing die is a fine-pitch routing die such that the pitch (e.g., line width and spacing) of the routing is smaller than the pitch of a typical redistribution structure. The routing die may be an integrated passive device (IPD), a surface mount device (SMD), a routing die free of active and passive devices, an integrated circuit die, or the like. The routing die can be bonded face-to-face with the one or more dies. In addition, the routing die may be encapsulated in the same encapsulant as the one or more dies. In some embodiments, a front-side redistribution structure for the package including the one or more dies and the routing die may overlie routing die fin such that the routing die is between the one or more dies and the front-side redistribution structure. The embodiments of the present disclosure can include a routing die that has a routing density that is five times greater than the routing density of a typical redistribution structure.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 15 illustrate cross-sectional views and plan views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
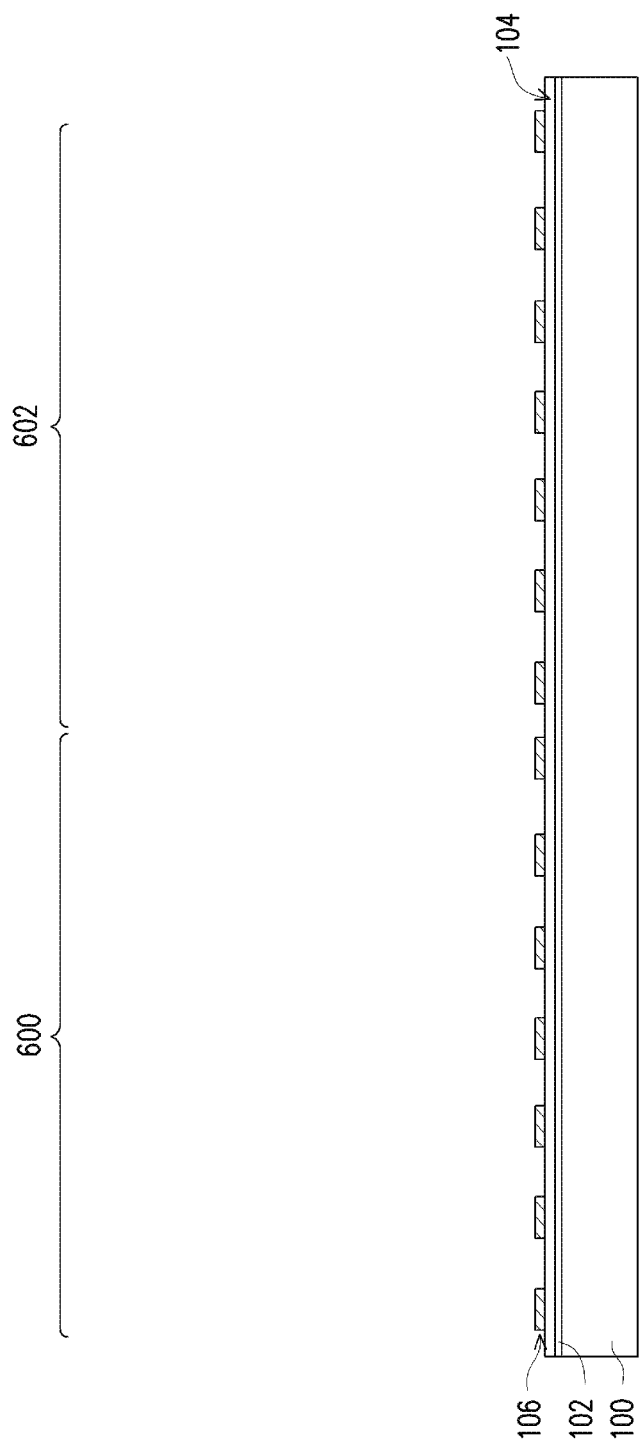

In FIG. 2, a dielectric layer 104 and a metallization pattern 106 (sometimes referred to as redistribution layers or redistribution lines) is formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
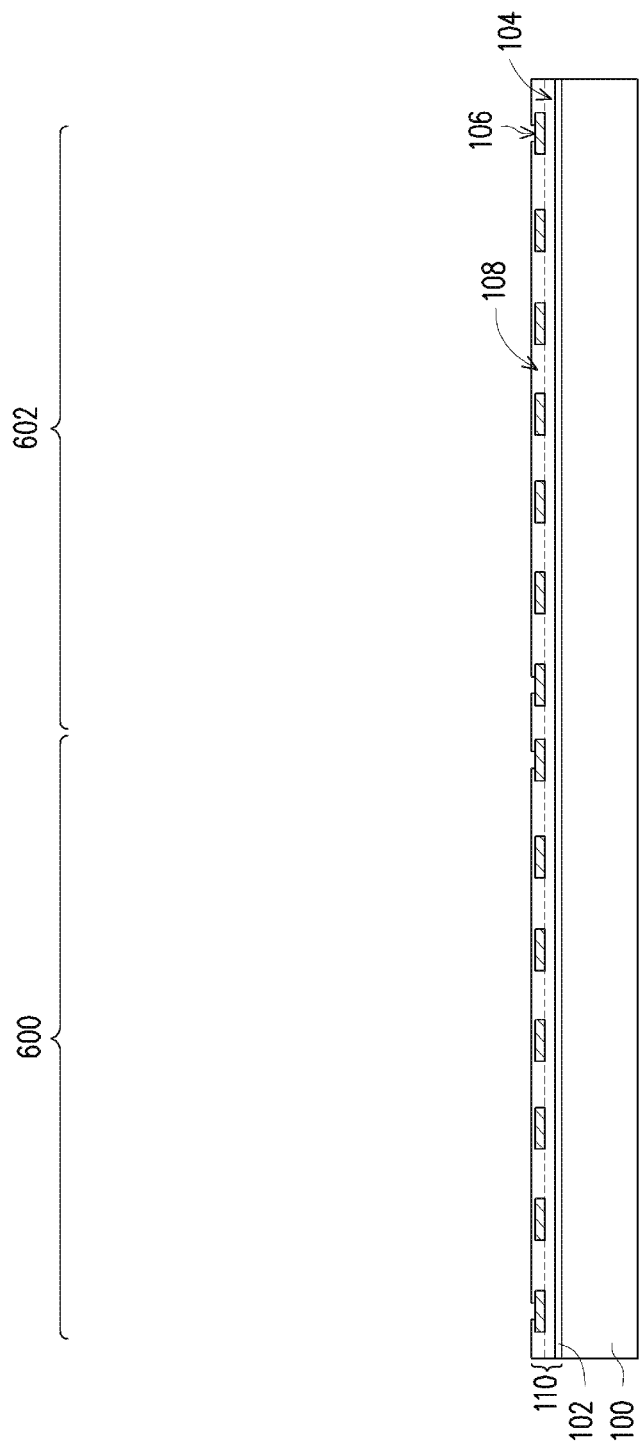

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization pattern 106 may be referred to as a back-side redistribution structure 110. In the embodiment shown, the back-side redistribution structure no includes the two dielectric layers 104 and 108 and one metallization pattern 106. In other embodiments, the back-side redistribution structure 110 can include any number of dielectric layers, metallization patterns, and conductive vias. One or more additional metallization pattern and dielectric layer may be formed in the back-side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

Figure 4:
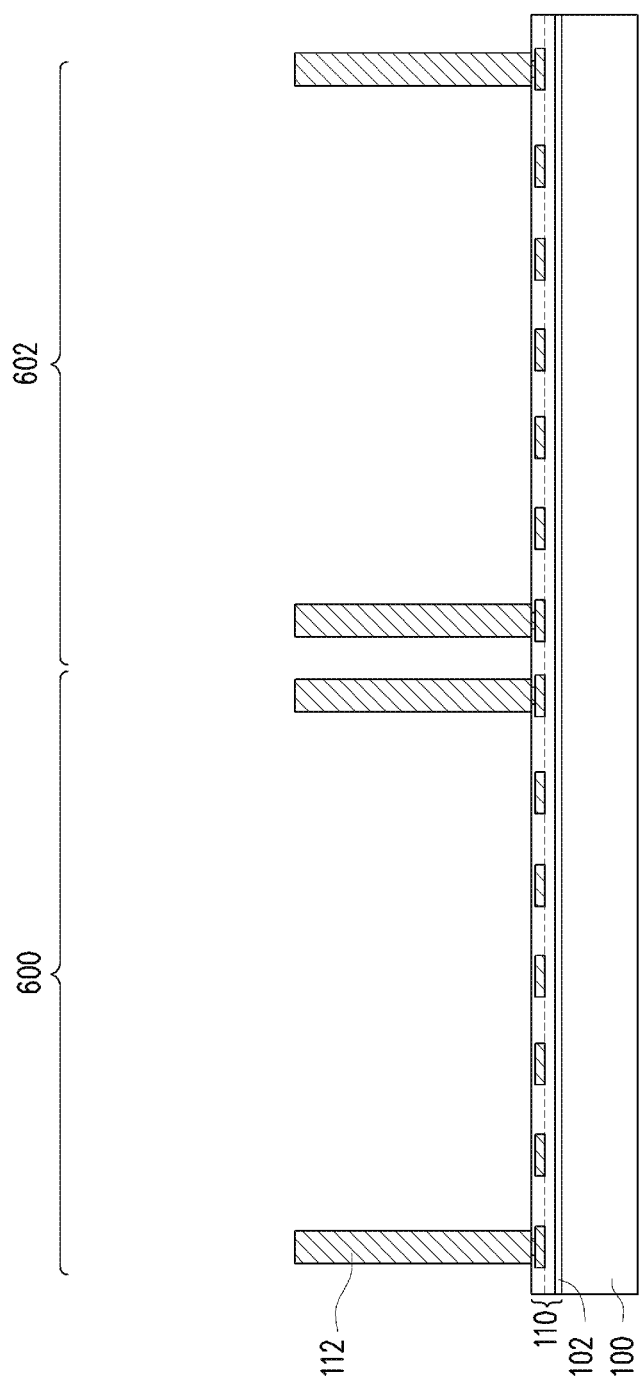

In FIG. 4, electrical connectors 112 are formed. The electrical connectors 112 will extend through the subsequently formed encapsulant 130 (see FIG. 9) and may be referred to as through vias 112 hereinafter. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 112.

Figure 5:
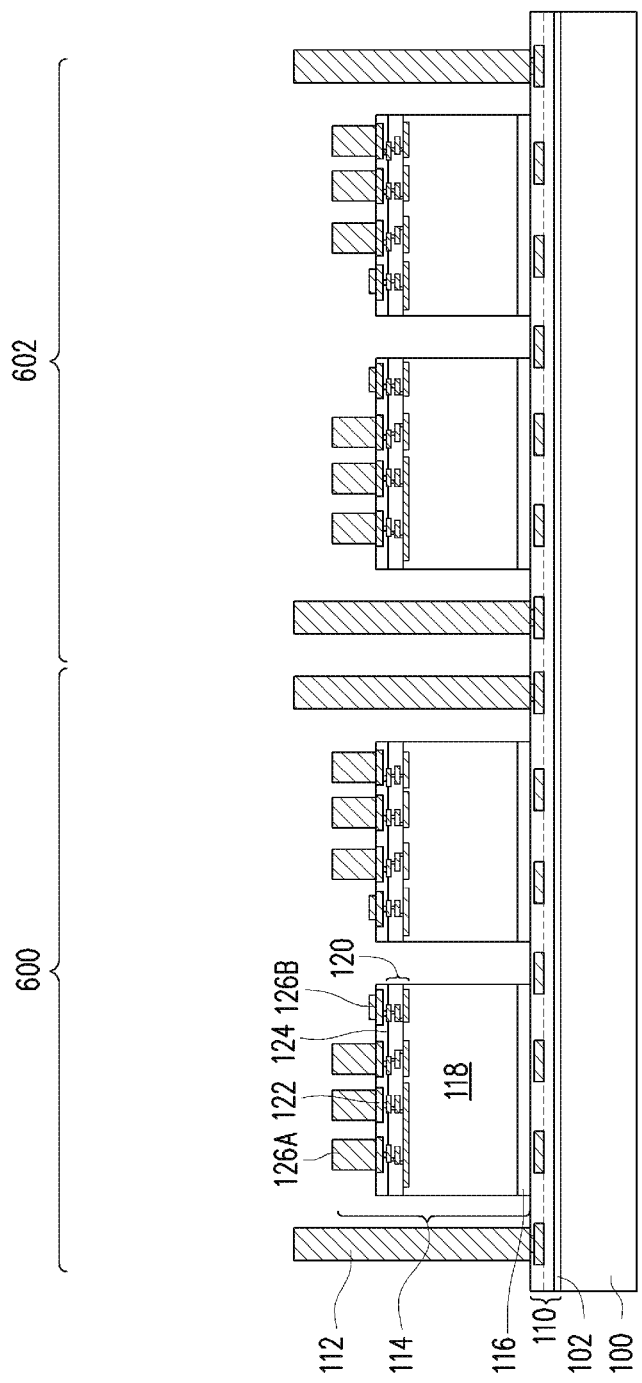

In FIG. 5, integrated circuit dies 114 are adhered to the release layer 102 by an adhesive 116. Although two integrated circuit dies 114 are illustrated as being adhered in each of the first package region 600 and the second package region 602, it should be appreciated that more or less integrated circuit dies 114 may be adhered in each package region. For example, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the release layer 102, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit. The interconnect structures 120 are formed using damascene and/or dual-damascene process, in some embodiments.

The integrated circuit dies 114 further comprise pads 122, such as copper pads or aluminum pads, to which external connections are made. The pads 122 are on what may be referred to as respective active sides of the integrated circuit dies 114. Passivation films 124 are on the integrated circuit dies 114 and may be on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrated circuit dies 114.

As illustrated in FIG. 5, the integrated circuit dies 114 can have different configurations of die connectors 126 (e.g., die connectors 126A and 126B). In some embodiments, the integrated circuit dies 114 include short die connectors 126B and tall die connectors 126A. The short die connectors 126B allow space for subsequently attached routing die (see, e.g., FIG. 7A) while also keeping the thickness of the package structure to minimum. The tall die connectors 126A allow for the integrated circuit dies 114 to be electrically coupled to a subsequently formed front-side redistribution structure 131 (see, e.g., FIG. 10) with the routing die between the integrated circuit dies 114 and the front-side redistribution structure 131. In some embodiments, these short and tall die connectors can be formed by similar processing with the short die connectors 126B undergoing an additional process (e.g., etch process) to make them shorter. In some embodiments, the tall die connectors 126A are formed in a separate formation process from the short die connectors 126B. For example, the tall die connectors 126A can be formed using a first formation process (e.g., a first plating process) and can then be covered with a mask while the short die connectors 126B are formed using a second formation process (e.g., a second plating process).

Adhesive 116 is on back-sides of the integrated circuit dies 114 and adheres the integrated circuit dies 114 to the release layer 102. The adhesive 116 may be any suitable adhesive, epoxy, die attach film (DAF), or the like. In some embodiments, the adhesive has a thickness in a range from about 5 μm to about 30 μm with the thickness being measured in a direction perpendicular to the back-side of the respective integrated circuit die 114. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the release layer 102 by the adhesive 116 using, for example, a pick-and-place tool.

Figure 6:
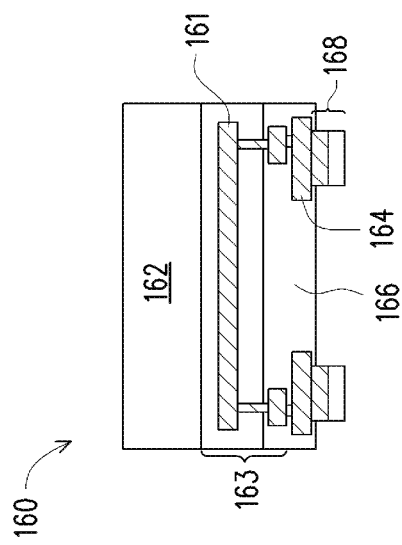

In FIG. 6, a routing die 160 is illustrated. The routing die 160 may be an integrated passive device (IPD), a surface mount device (SMD), a routing die free of active and passive devices, an integrated circuit die, or the like. The routing die 160 may be processed using similar processes as described above for the integrated circuit dies 114. For example, the routing die 160 each include a substrate 162, an interconnect structure 163, and routing pads 164. The substrate 162 can be formed of a semiconductor material, such as silicon, doped or undoped, or an active layer of a semiconductor-on-insulator (SOI) substrate. The substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The interconnect structures 163 are formed by, for example, the metallization patterns 161 in one or more dielectric layers on the substrate 162. The interconnect structures 163 are formed using damascene and/or dual-damascene process, in some embodiments. In some embodiments, the metallization patterns 161 of the interconnect structure 163 are fine-pitch metallization patterns such that the pitch (e.g., line width and spacing) of the metallization patterns is smaller than the pitch of a typical redistribution structure. In some embodiments, the line width of the fine-pitch metallization patterns is in a range from 0.03 μm to about 12 μm, such as about 0.4 μm, and the spacing between lines of the fine-pitch metallization patterns is in a range from 0.03 μm to about 12 μm, such as about 0.4 μm.

In some embodiments, the routing die 160 is free from active and passive devices and is used for routing signals between integrated circuit dies 114. In some embodiments, devices, such as transistors, diodes, capacitors, resistors, etc., may be formed in and/or on the substrate 162 and may be interconnected by the interconnect structures 163 to form an integrated circuit.

The routing die 160 further comprises pads 164, such as copper pads or aluminum pads, to which external connections are made. Passivation films 166 are on the routing die 160 and may be on portions of the pads 164. Openings are through the passivation films 166 to the pads 164. Die connectors 168, such as conductive pillars (for example, comprising a metal such as copper with or without a solder cap layer), are in the openings through passivation films 166 and are mechanically and electrically coupled to the respective pads 164. The die connectors 168 may be formed by, for example, plating, or the like. The die connectors 168 are electrically coupled to the respective metallization patterns 161 of the routing die 160.

Figure 7A:
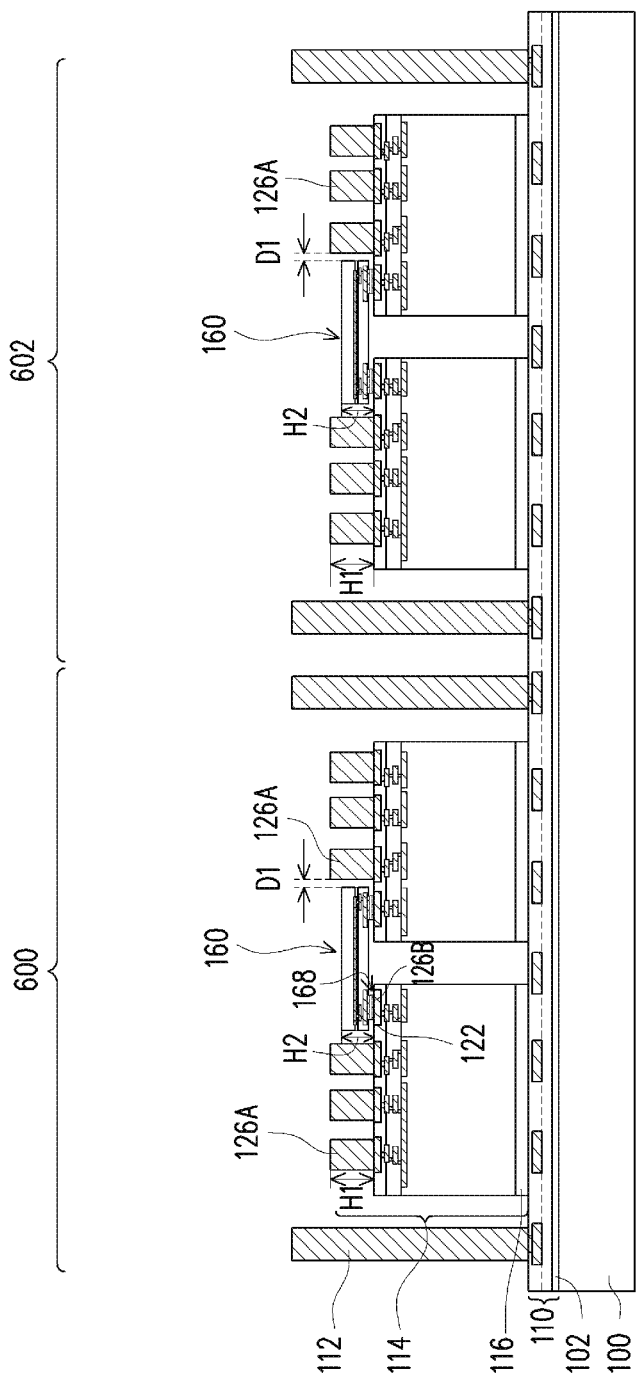
Figure 7B:
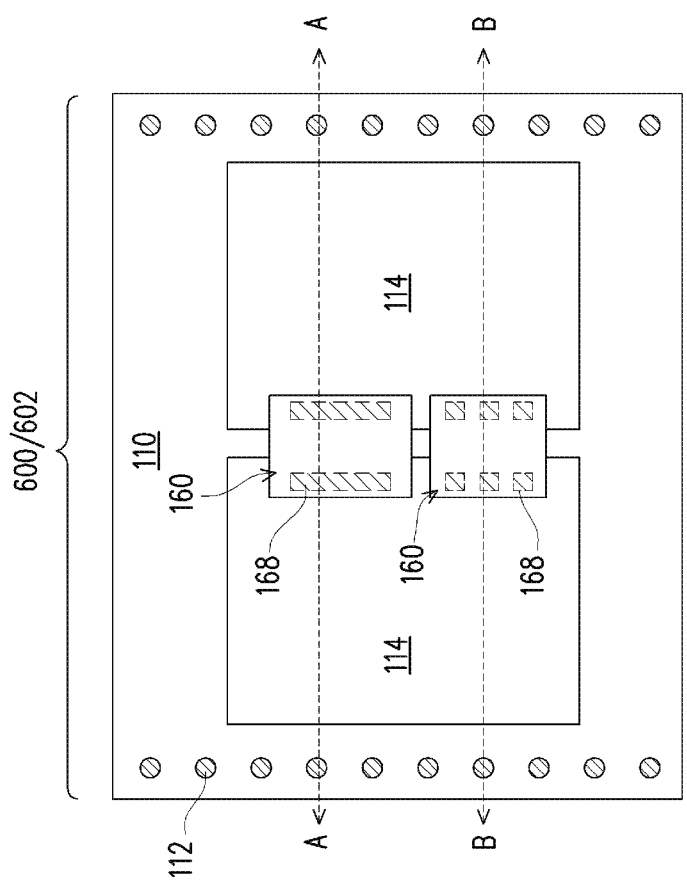

In FIGS. 7A and 7B, the routing dies 160 are bonded to the integrated circuit dies 114. In some embodiments, the die connectors 168 of the routing dies 160 are bonded to the short die connectors 126B of the integrated circuit dies 114. In some other embodiments, die connectors 168 are bonded to the metal pads 122 such that the short die connectors 126B are not present over those metal pads 122. In some embodiments, the routing dies 160 electrically couple the adjacent integrated circuit dies 114 to each other and allow for increased routing density over structures that only include a front-side redistribution structure (such as front-side redistribution structure 131 in FIG. 10).

The bonding between the routing dies 160 and the integrated circuit dies 114 may be a solder bonding or a direct metal-to-metal (such as a copper-to-copper or tin-to-tin) bonding. In an embodiment, the routing dies 160 are bonded to the integrated circuit dies 114 by a reflow process. During this reflow process, the die connectors 168 are in contact with the die connectors 126B to physically and electrically connect the routing dies 160 to the integrated circuit dies 114. After the bonding process, an intermetallic compound (IMC) (not shown) may form at the interface of the die connectors 126 and die connectors 168.

After the routing die 160 is bonded to the integrated circuit dies 114, the routing die 160 is separated from the nearest adjacent tall die connector 126A by a distance D1. In some embodiments, the distance D1 is greater than or equal to about 2 µm, such as 3 µm. The bonded routing die also has a height H2 as measured from the metal pad 122 to a backside of the routing die 160. This height H2 is less than the height H1 of the tall die connectors 126A. The height H1 of the tall die connectors 126A is measured from the metal pad 122 to a top surface of the die connector 126A. In some embodiments, the height H1 is at least about 3 µm greater than the height H2, such as the height H1 being 4 µm greater than the height H2.

FIG. 7B illustrates a plan view of the structure in FIG. 7A. As illustrated in FIG. 7B, there can be multiple routing dies 160 coupled to and between a pair of integrated circuit dies 114. The cross-sectional view of FIG. 7A can be along either line A-A or line B-B of FIG. 7B. FIG. 7B further illustrates that each of the routing dies 160 can have a different number and configuration of die connectors 168, such as, two, four, six, ten, twenty, or hundreds of die connectors 168.

Figure 8:
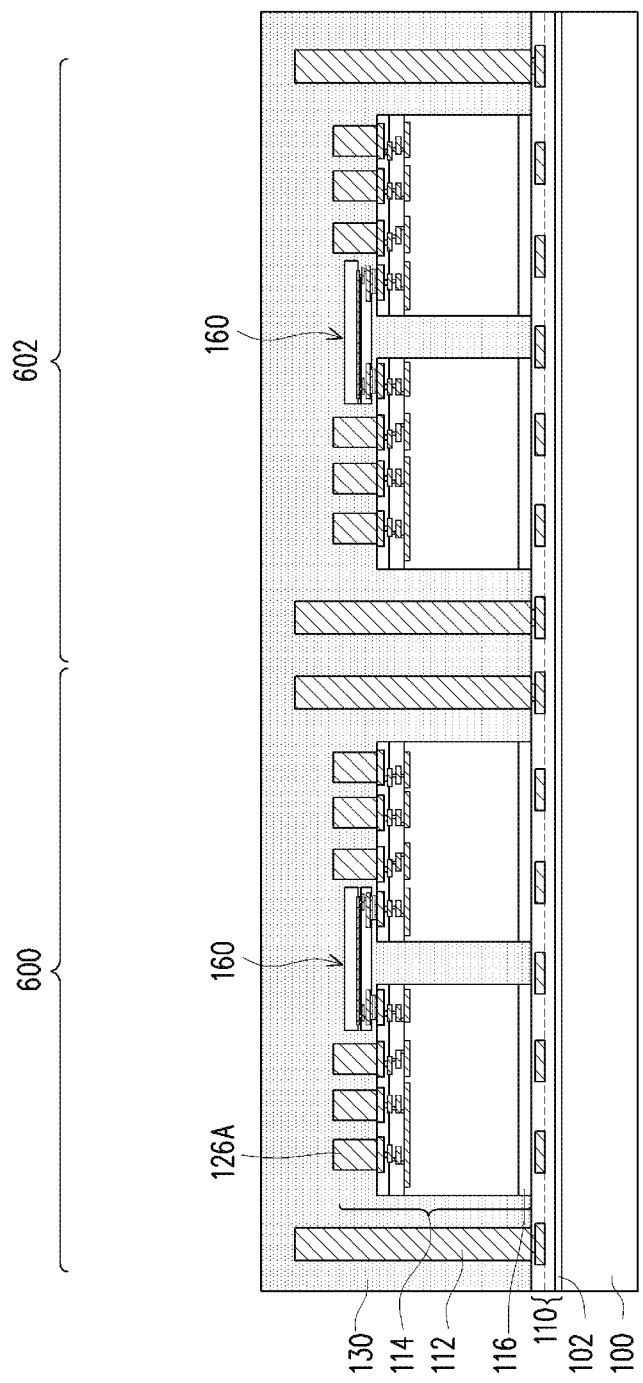

In FIG. 8, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such the electrical connectors 112, the tall die connectors 126A, and the routing dies 160 are buried or covered. The encapsulant 130 extends between the routing dies 160 and the integrated circuit dies 114 they are bonded to. In some embodiments, the encapsulant surrounds the die connectors 168 of the routing dies 160 and the tall and short die connectors 126A/B of the integrated circuit dies 114. The encapsulant 130 may then be cured.

Figure 9:
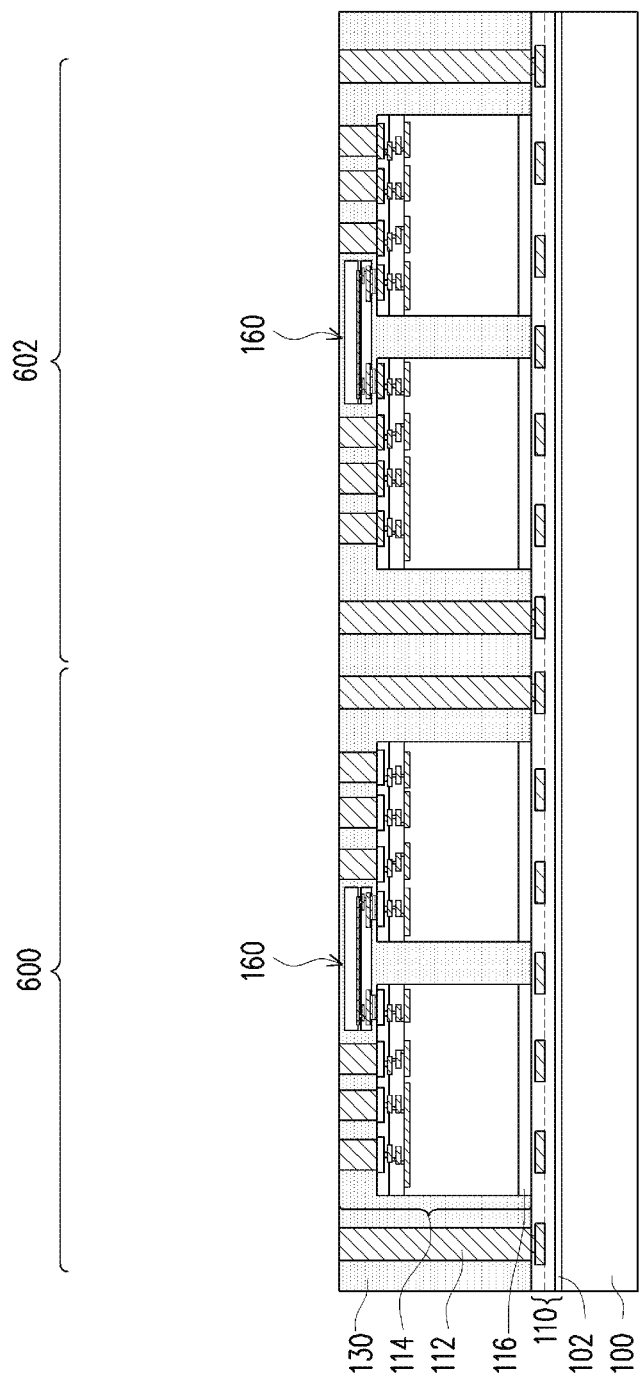

In FIG. 9, the encapsulant 130 can undergo a grinding process to expose the electrical connectors 112 and the tall die connectors 126A. Top surfaces of the electrical connectors 112, tall die connectors 126A, and encapsulant 130 are level after the grinding process. In some embodiments, the grinding may be omitted, for example, if electrical connectors 112 and the tall die connectors 126A are already exposed. The electrical connectors 112 may be referred to as through vias 112 hereinafter. In some embodiments, backsides of the routing dies 160 are covered after the grinding process. In some embodiments, at least portions of the backsides of the routing dies 160 are exposed after the grinding process.

Figure 10:
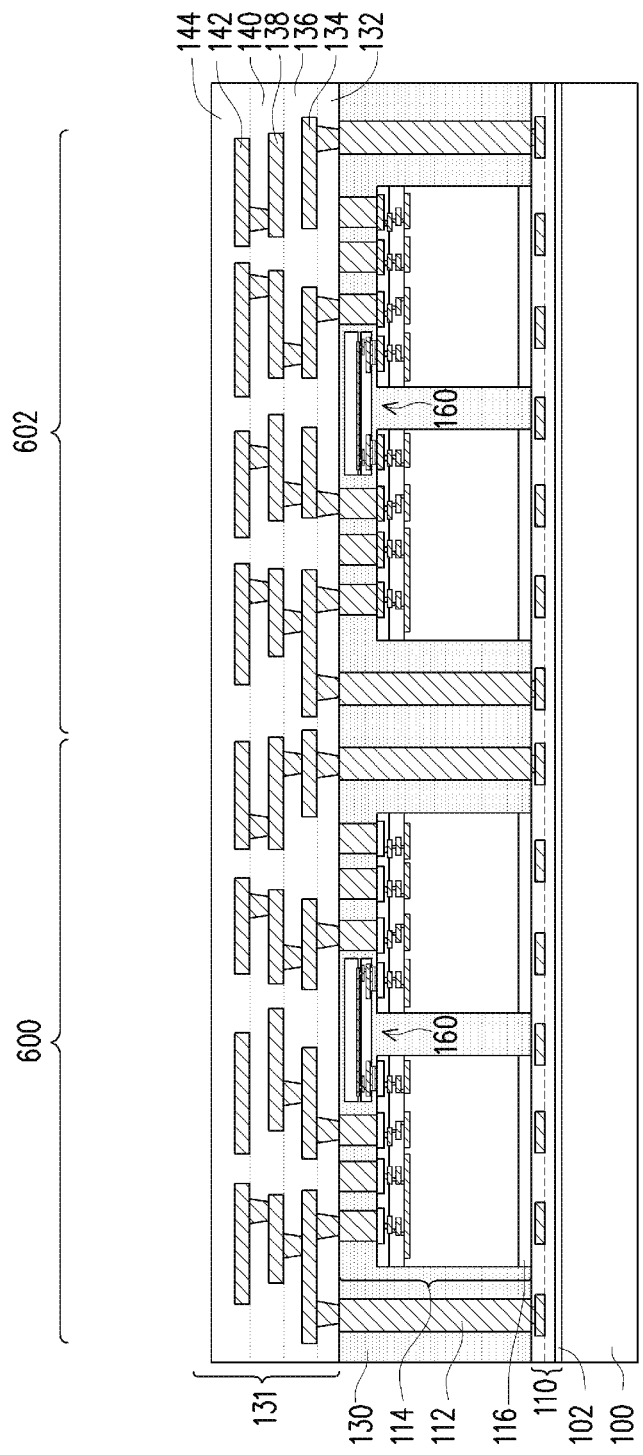

In FIG. 10, a front-side redistribution structure 131 is formed. The front-side redistribution structure 131 includes dielectric layers 132, 136, 140, and 144 and metallization patterns 134, 138, and 142.

The formation of the front-side redistribution structure 131 may begin by depositing dielectric layer 132 on the encapsulant 130, through vias 112, and die connectors 126A. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Next, the dielectric layer 132 is then patterned. The patterning forms openings to expose portions of the through vias 112 and the tall die connectors 126A. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Next, metallization pattern 134 with vias is formed on the dielectric layer 132. As an example to form metallization pattern 134, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 134. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the tall die connectors 126A.

This process may be repeated with dielectric layers 136 and 140, and metallization patterns and vias 138 and 142 to continue the formation of the redistribution structure 131. The materials and processes used to form these layers of the redistribution structure 131 may be similar to the dielectric layer 132 and metallization pattern and vias 134 and the description is not repeated herein.

After the formation of the metallization pattern and vias 142, the dielectric layer 144 is deposited on the metallization pattern 142 and the dielectric layer 140. In some embodiments, the dielectric layer 144 is formed of a polymer, which may be a photo-sensitive material such as PBO, polyimide, BCB, or the like, that may be patterned using a lithography mask. In other embodiments, the dielectric layer 144 is formed of a nitride such as silicon nitride; an oxide such as silicon oxide, PSG, BSG, BPSG; or the like. The dielectric layer 144 may be formed by spin coating, lamination, CVD, the like, or a combination thereof.

Figure 11:
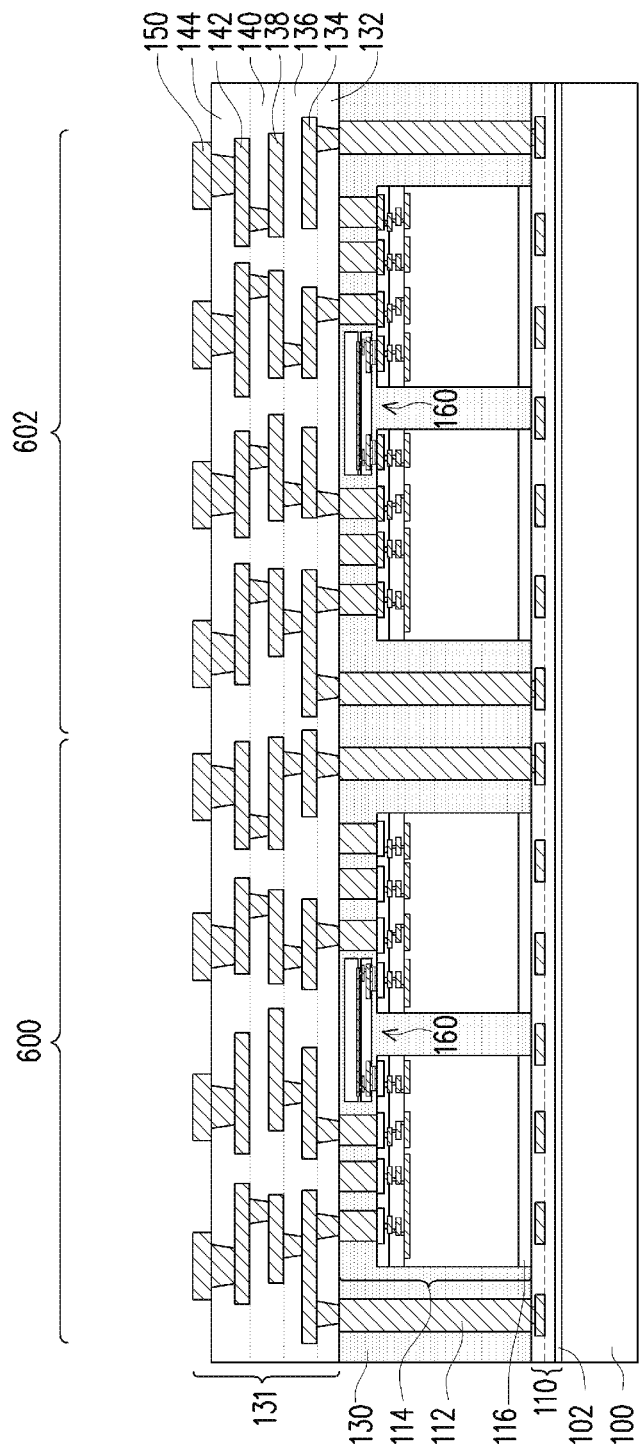

In FIG. 11, the dielectric layer 144 is then patterned. The patterning forms openings to expose portions of the metallization pattern 142. The patterning may be by an acceptable process, such as by exposing the dielectric layer 144 to light when the dielectric layer is a photo-sensitive material or by etching using, for example, an anisotropic etch. If the dielectric layer 144 is a photo-sensitive material, the dielectric layer 144 can be developed after the exposure.

The front-side redistribution structure 131 is shown as an example. More or fewer dielectric layers and metallization patterns may be formed in the front-side redistribution structure 131. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

In some embodiments, the routing dies 160 can have a routing density that is about five times greater than the routing density that is possible for the front-side redistribution structure 131. For example, the metallization patterns of the front-side redistribution structure 131 can have line width in a range from about 2 μm to about 15 μm, and the spacing between lines of the metallization patterns of the front-side redistribution structure 131 can be in a range from about 2 μm to about 15 μm. As discussed above, the routing dies 160 can have line width/spacing in a range from 0.03 μm/0.03 μm to about 12 μm/12 μm, such as about 0.4 μm/0.4 μm.

Thus, in embodiments where the line width and spacing of the routing dies are about 0.03 μm/0.03 μm, the routing density of the routing dies can be about 66 times greater than the smallest routing density of the front-side redistribution structure 131 and/or about 500 times greater than the largest routing density of the front-side redistribution structure 131. In embodiments where the line width and spacing of the routing dies are about 0.4 μm/0.4 μm, the routing density of the routing dies can be about 5 times greater than the smallest routing density of the front-side redistribution structure 131 and/or about 375 times greater than the largest routing density of the front-side redistribution structure 131. In embodiments where the line width and spacing of the routing dies are about 12 μm/12 μm, the routing density of the routing dies can be about 6 times less than the smallest routing density of the front-side redistribution structure 131 and/or about 1.25 times greater than the largest routing density of the front-side redistribution structure 131.

Further in FIG. 11, pads 150 are formed on an exterior side of the front-side redistribution structure 131. The pads 150 are used to couple to conductive connectors 152 (see FIG. 12) and may be referred to as under bump metallurgies (UBMs) 150. In the illustrated embodiment, the pads 150 are formed through openings through the dielectric layer 144 to the metallization pattern 142. As an example to form the pads 150, a seed layer (not shown) is formed over the dielectric layer 144. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 150. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 150. In the embodiment, where the pads 150 are formed differently, more photo resist and patterning steps may be utilized.

Figure 12:
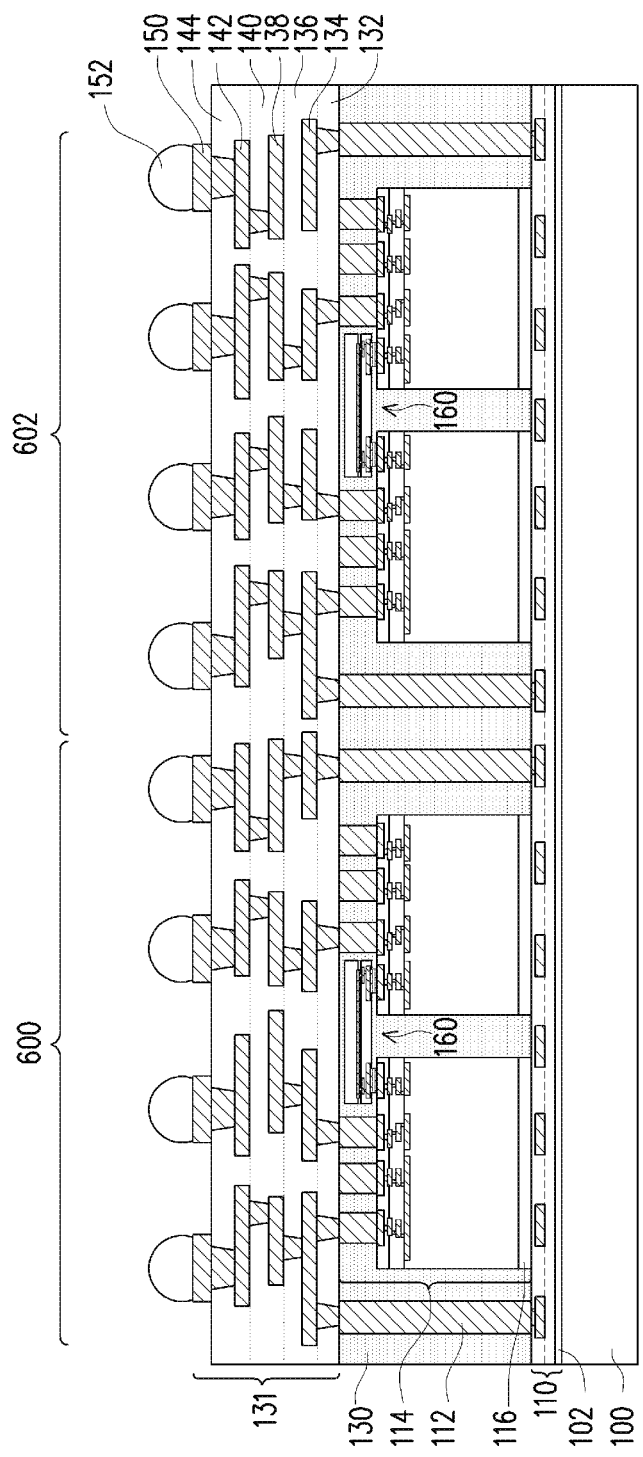

In FIG. 12, conductive connectors 152 are formed on the UBMs 150. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 152 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 152. The metal cap layer may include nickel, tin, tin-lead, gold, silver, palladium, indium, nickel-palladium-gold, nickel-gold, the like, or a combination thereof and may be formed by a plating process.

Figure 13:
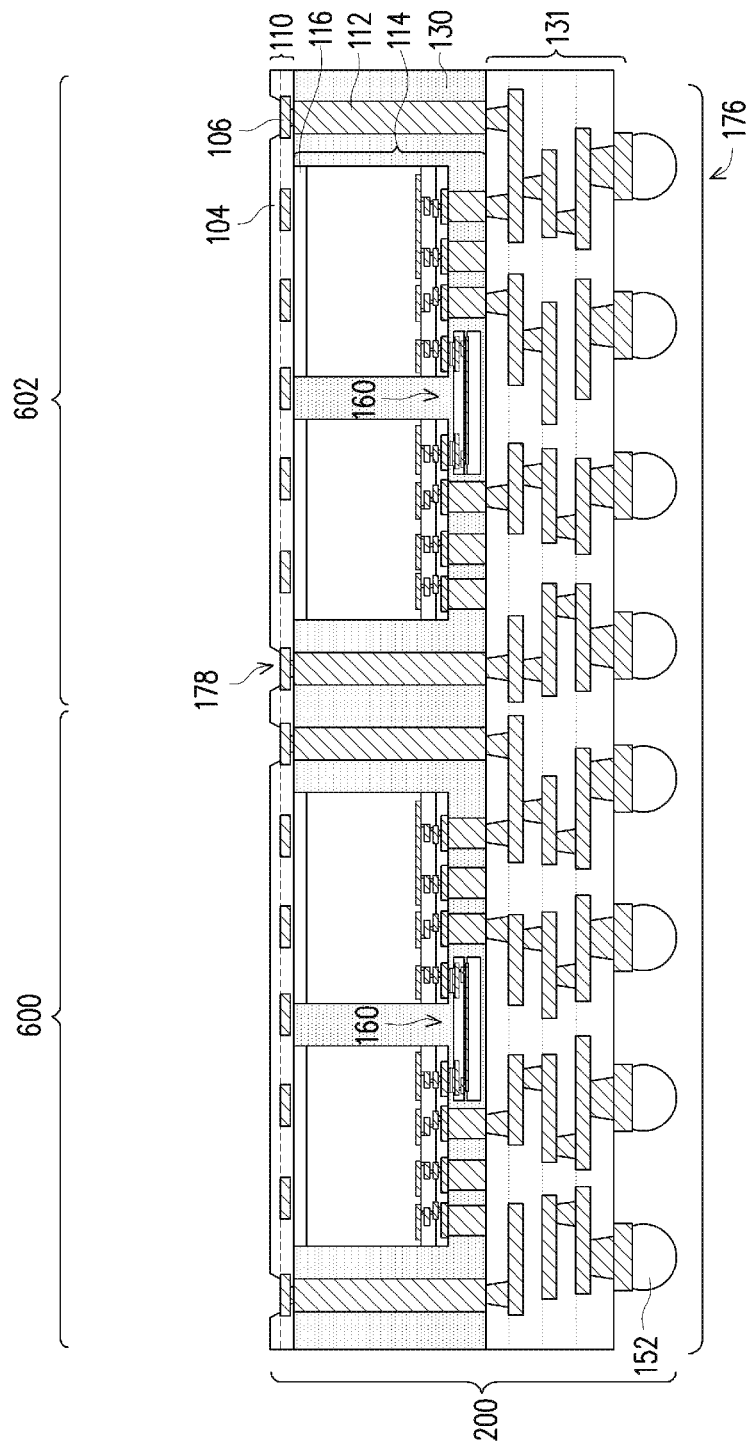

In FIG. 13, a carrier substrate de-bonding is performed to detach (de-bond) the carrier substrate 100 from the back-side redistribution structure 110, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 176. Further, openings 178 are formed through the dielectric layer 104 to expose portions of the metallization pattern 106. The openings 178 may be formed, for example, using laser drilling, etching, or the like.

Figure 14:
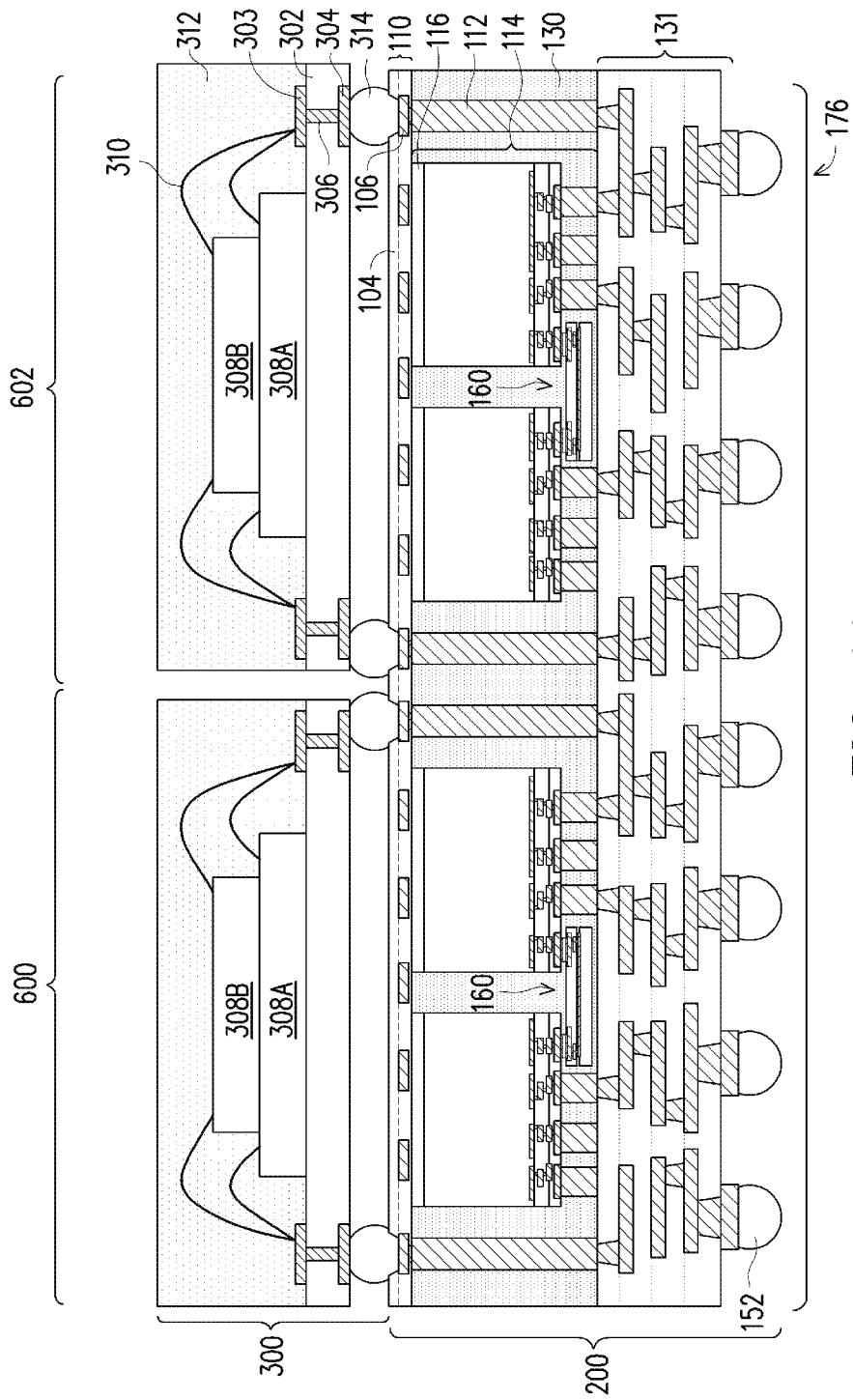
Figure 15:
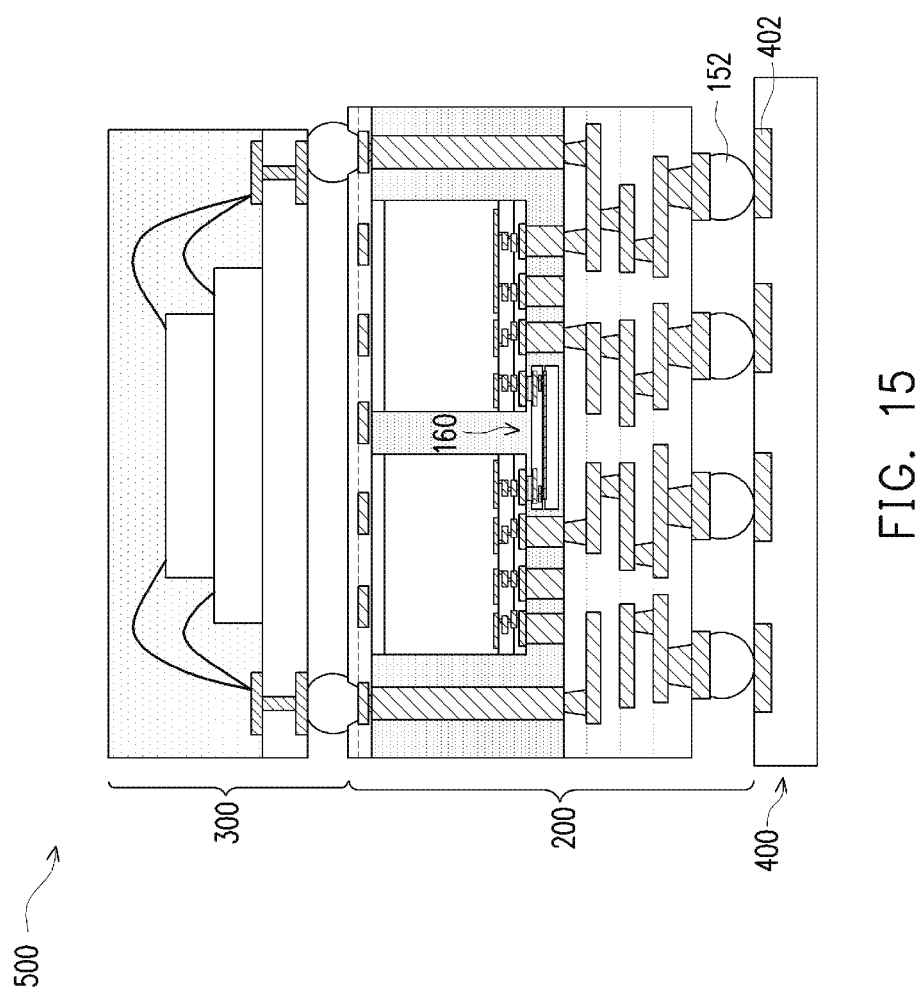

FIGS. 14 and 15 illustrate cross-sectional views of intermediate steps during a process for forming a package structure 500, in accordance with some embodiments. The package structure 500 may be referred to a package-on-package (PoP) structure.

In FIG. 14, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 152 described above and the description is not repeated herein, although the conductive connectors 314 and the conductive connectors 152 need not be the same. The conductive connectors 314 may be disposed on an opposing side of the substrate 302 as the stacked dies 308, in the openings 178. In some embodiments, a solder resist (not separately labeled) may also be formed on the side of the substrate opposing the stacked dies 308. The conductive connectors 314 may be disposed in openings in the solder resist to be electrically and mechanically coupled to conductive features (e.g., the bond pads 304) in the substrate 302. The solder resist may be used to protect areas of the substrate 302 from external damage.

In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization pattern 106.

In some embodiments, the conductive connectors 314 may have an optional epoxy flux (not shown) formed thereon before they are reflowed with at least some of the epoxy portion of the epoxy flux remaining after the second package 300 is attached to the first package 200.

An underfill (not shown) may be formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

The bonding between the second package 300 and the first package 200 may be a solder bonding. In an embodiment, the second package 300 is bonded to the first package 200 by a reflow process. During this reflow process, the conductive connectors 314 are in contact with the bond pads 304 and the metallization pattern 106 to physically and electrically couple the second package 300 to the first package 200. After the bonding process, an intermetallic compound (IMC, not shown) may form at the interface of the metallization pattern 106 and the conductive connectors 314 and also at the interface between the conductive connectors 314 and the bond pads 304 (not shown).

A singulation process is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process is performed after the second package 300 is attached to the first package 200. In other embodiments (not shown), the singulation process is performed before the second package 300 is attached to the first package 200, such as after the carrier substrate 100 is de-bonded and the openings 178 are formed.

In FIG. 15, the first package 200 is mounted to a package substrate 400 using the conductive connectors 152. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 152 are reflowed to attach the first package 200 to the bond pads 402. The conductive connectors 152 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 152.

The conductive connectors 152 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 152. In some embodiments, an underfill (not shown) may be formed between the first package 200 and the package substrate 400 and surrounding the conductive connectors 152. The underfill may be formed by a capillary flow process after the first package 200 is attached or may be formed by a suitable deposition method before the first package 200 is attached.

FIGS. 16 through 19 illustrate cross-sectional views of another package structure in accordance with some embodiments. The embodiment in FIGS. 16 through 19 is similar to the embodiment illustrated in FIGS. 1 through 15 except that this embodiment includes a routing die 160 that has through vias 170 extending through the substrate 162 of the routing die 160. Details regarding this embodiment that are similar to those for the previously described embodiment will not be repeated herein.

Figure 16:
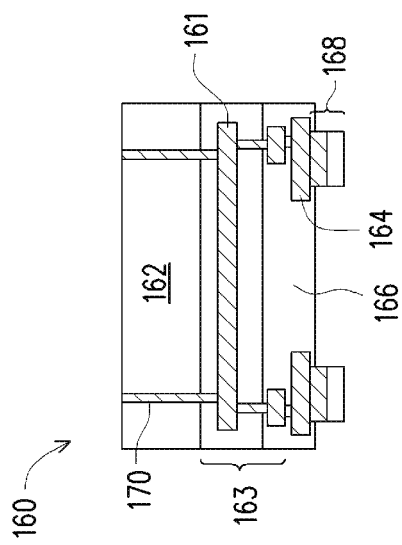
FIGS. 16 through 19 illustrate cross-sectional views of intermediate steps during a process for forming a package structure in accordance with some embodiments.

In FIG. 16, the routing die 160 is illustrated including the through vias 170. Details regarding this embodiment of the routing die 160 that are similar to those for the previously described routing die 160 embodiment will not be repeated herein.

In this embodiment, the through vias 170 extend from the metallization patterns 161 of the interconnect structure 163 through the substrate 162 to a backside of the substrate 162. The through vias 170 can be exposed at the backside of the substrate 162 and the exposed portion can be electrically coupled to an overlying conductive feature (e.g., metallization patterns within an overlying redistribution structure).

Although two through vias 170 are illustrated in the routing die 160, it should be appreciated that there may be more or less through vias 170 in each routing die 160.

Figure 17:
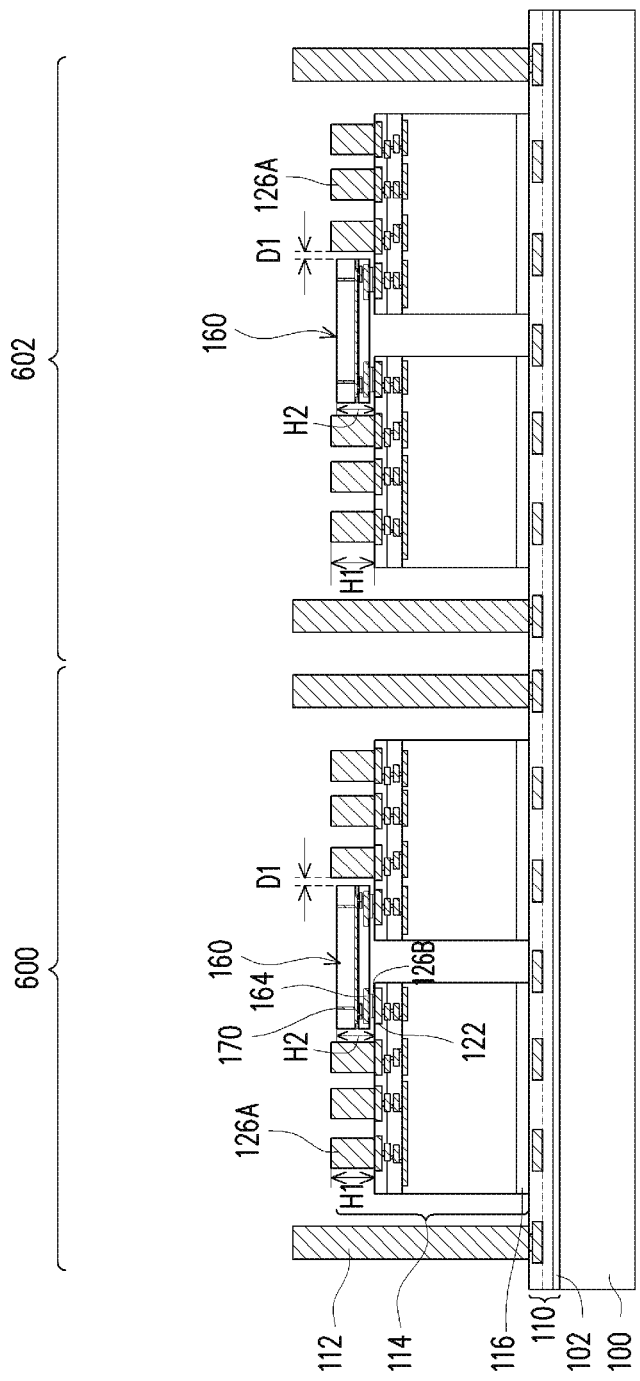

FIG. 17 illustrates an equivalent intermediate stage of processing as FIGS. 7A and 7B described above and the description is not repeated herein. In FIG. 17, the routing dies 160 are bonded to the integrated circuit dies 114. In some embodiments, the die connectors 168 of the routing dies 160 are bonded to the short die connectors 126B of the integrated circuit dies 114. In some other embodiments, die connectors 168 are bonded to the metal pads 122 such that the short die connectors 126B are not present over those metal pads 122. In some embodiments, the routing dies 160 electrically couple the adjacent integrated circuit dies 114 to each other and to overlying conductive features and allow for increased routing density over structures that only include a front-side redistribution structure (such as front-side redistribution structure 131 in FIG. 10).

Similar to the previous embodiment, the height H2 of the routing dies 160 can initially be less than the height H1 of the tall die connectors 126A. In this embodiment, the height difference between H1 and H2 will be removed in a subsequent planarization process (e.g., grinding the encapsulant 130) such that the through vias 170 of the routing die 160 will have top surfaces level with top surfaces of the tall die connectors 126A and the through vias 112 (see, e.g., FIG. 18). In some embodiments, the height H2 of the routing dies 160 can initially be about the same as the height H1 of the tall die connectors 126A and no leveling is necessary to bring them to the same height.

Figure 18:
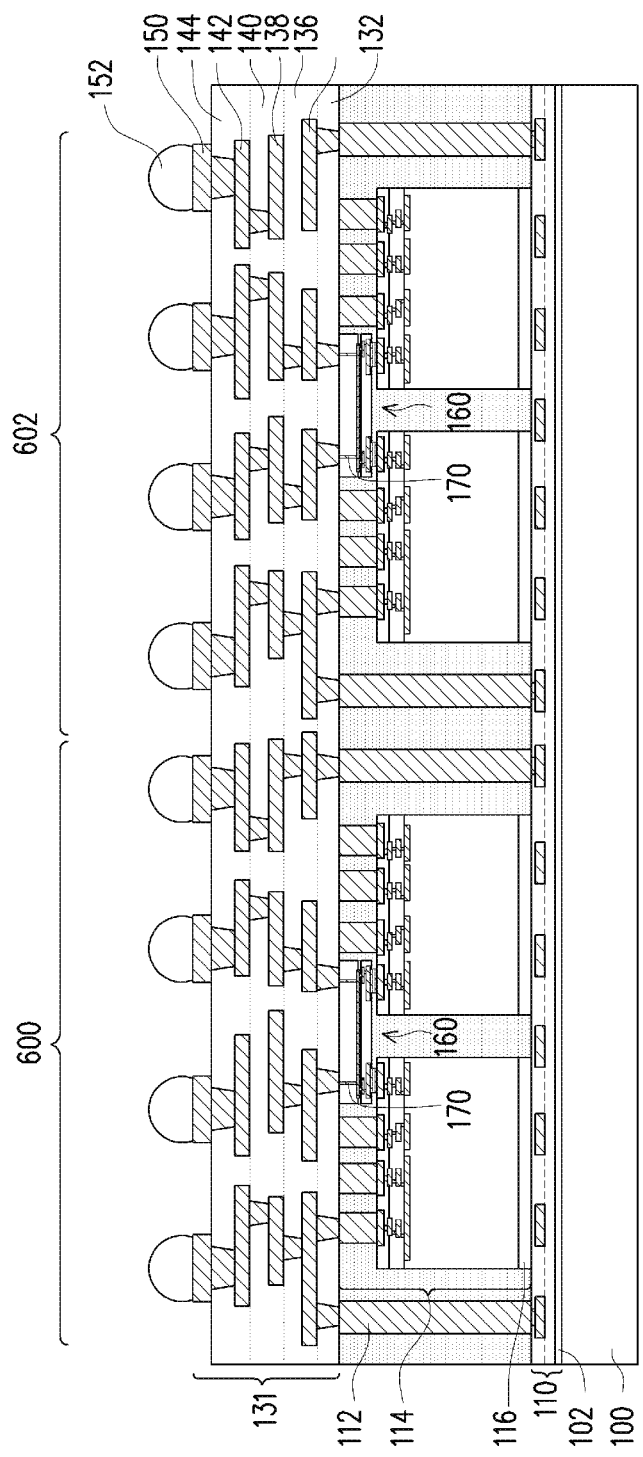

FIG. 18 illustrates further processing on the structure of FIG. 17. The processing between these two figures is similar to the processing illustrated and described above in reference to FIGS. 8 through 12 with FIG. 12 being an equivalent intermediate stage as FIG. 18 and the descriptions are not repeated herein.

In FIG. 18, the through vias 170 of the routing dies 160 are physically and electrically connected to metallization patterns and vias 132 of the front-side redistribution structure 131. The through vias 170 can simplify the routing of lines and signals in the front-side redistribution structure 131.

Figure 19:
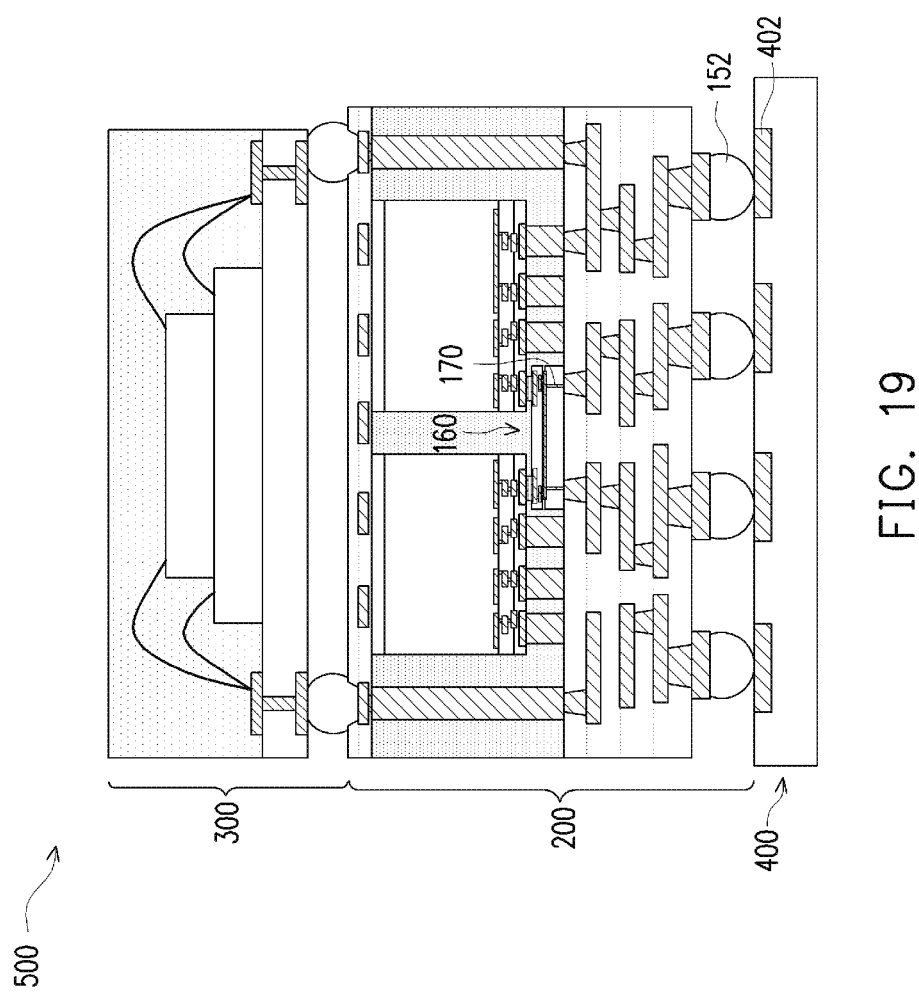

FIG. 19 illustrates further processing on the structure of FIG. 18. The processing between these two figures is similar to the processing illustrated and described above in reference to FIGS. 13 through 15 with FIG. 14 being an equivalent stage of manufacture as FIG. 19 and the descriptions are not repeated herein.

In FIG. 19, the package structure 200 including the routing die 160 with the through vias 170 is included in the package structure 500. Details regarding this embodiment that are similar to those for the previously described embodiment will not be repeated herein.

By including a routing die connecting one or more dies in the package structure, the routing density of the package structure can be increased. In some embodiments, the routing die is a fine-pitch routing die such that the pitch (e.g., line width and spacing) of the routing is smaller than the pitch of a typical redistribution structure. The routing die may be an integrated passive device (IPD), a surface mount device (SMD), a routing die free of active and passive devices, an integrated circuit die, or the like. The routing die can be bonded face-to-face with the one or more dies. In addition, the routing die may be encapsulated in the same encapsulant as the one or more dies. In some embodiments, a front-side redistribution structure for the package including the one or more dies and the routing die may overlie the routing die fin such that the routing die is between the one or more dies and the front-side redistribution structure. The embodiments of the present disclosure can include a routing die that has a routing density that can be 66 times greater than the routing density of a typical redistribution structure. In addition, the package structure including the routing die can have less warpage and be manufactured in a way that saves time as compared to another package structure that attempts to achieve similar routing density in the redistribution structure.

In an embodiment, a package includes a first package structure including a first integrated circuit die having an active side and a back-side, the active side including die connectors, a second integrated circuit die adjacent the first integrated circuit die, the second integrated circuit die having an active side and a back-side, the active side including die connectors, a routing die bonded to the first integrated circuit die and the second integrated circuit die, the routing die having a front-side and a back-side, the front-side of the routing die including die connectors, the die connectors of the routing die being bonded to the active sides of the first integrated circuit die and the second integrated circuit die, the routing die electrically coupling the first integrated circuit die to the second integrated circuit die, an encapsulant encapsulating the first integrated circuit die, the second integrated circuit die, and the routing die, and a first redistribution structure on and electrically connected to the die connectors of the first integrated circuit die and the second integrated circuit die, the routing die being between the first redistribution structure and the first integrated circuit die and the second integrated circuit die.

Embodiments may include one or more of the following features. The package where the first package structure further includes a first through via adjacent the first integrated circuit die, the first through via extending through the encapsulant. The package further including a second package structure bonded to the first through by way of a first set of conductive connectors. The package where the first package structure further includes a second redistribution structure over the electrically connected to the first through via, the second redistribution structure being between the first integrated circuit die and the second package structure. The package further including a package substrate bonded to the first redistribution structure of the first package structure by way of a second set of conductive connectors. The package where the encapsulant extends between the routing die and the first integrated circuit die and the second integrated circuit die, the encapsulant surrounding the die connectors of the routing die. The package where the encapsulant extends between the routing die and the first redistribution structure. The package where the routing die includes a substrate, an interconnect structure on the substrate, the interconnect structure including metallization patterns in one or more dielectric layers, and die connectors electrically coupled to the metallization patterns of the interconnect structure. The package where the routing die further includes a through via extending through the substrate, the through via being physically and electrically connected to the first redistribution structure. The package where the routing die includes active or passive devices. The package where the routing die is substantially free of active and passive devices.

In an embodiment, a method includes forming a first package including forming an electrical connector over a carrier substrate, attaching a back-side of a first die to the carrier substrate using an adhesive layer, the first die being adjacent the electrical connector, attaching a back-side of a second die to the carrier substrate using an adhesive layer, the second die being adjacent the first die, bonding a routing die to active sides of the first and second dies using die connectors on the routing die, the routing die electrically coupling the first and second dies, encapsulating the first die, the second die, the routing die, and the electrical connector with a molding compound, forming a first redistribution structure over the first die, the second die, the routing die, the molding compound, and the electrical connector, and removing the carrier substrate, and bonding a second package to the first package using a first set of conductive connectors, the second package being proximate the back-sides of the first die and the second die.

Embodiments may include one or more of the following features. The method further including forming a second redistribution structure over the back-sides of the first die and the second die and over the first end of the electrical connector, the second redistribution structure being electrically connected to the electrical connector, the second package being bonded to the second redistribution structure. The method where the molding compound extends between the routing die and the first die and the second die, the molding compound surrounding the die connectors of the routing die. The method where the molding compound extends between the routing die and the first redistribution structure. The method further including planarizing the molding compound, die connectors on active sides of the first die and the second die, and the electrical connector to have level surfaces. The method where the routing die includes a substrate, an interconnect structure on the substrate, the interconnect structure including metallization patterns in one or more dielectric layers, a through via extending through the substrate, the through via being physically and electrically connected to the first redistribution structure, and die connectors electrically coupled to the metallization patterns of the interconnect structure. The method where the second and fourth sets of die connectors of the first and second dies are adjacent the routing die and extend from a front-side of the routing die to the back-side of the routing die. The method where die connectors of the second and fourth sets of die connectors have a first height, and where the routing die has a second height, the first height being greater than the second height.

In an embodiment, a method includes forming a first package including forming an electrical connector over a carrier substrate, adhering a first die to the carrier substrate, an active side of the first die including a first set and a second set of die connectors, the active side being opposite a back-side, the first die being adjacent the electrical connector, adhering a second die to the carrier substrate, an active side of the second die including a third set and a fourth set of die connectors, the active side being opposite a back-side, the second die being adjacent the first die, bonding a routing die to the first and second dies using the first and third sets of die connectors, encapsulating the first die, the second die, the routing die, and the electrical connector with a molding compound, forming a redistribution structure overlying the active side of the first die, the molding compound, and the electrical connector, the redistribution structure being electrically coupled to the second and fourth sets of die connectors and the electrical connector, and removing the carrier substrate, and bonding a second package to the first package using the first set of conductive connectors, the second package being proximate a back-side of the routing die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package structure comprising:
        a first integrated circuit die having an active side and a back-side, the active side comprising die connectors;
        a second integrated circuit die adjacent the first integrated circuit die, the second integrated circuit die having an active side and a back-side, the active side comprising die connectors;
        a first routing die bonded to the first integrated circuit die and the second integrated circuit die, the first routing die having a front-side and a back-side, the front-side of the first routing die comprising die connectors, the die connectors of the first routing die being bonded to the active sides of the first integrated circuit die and the second integrated circuit die, the first routing die electrically coupling the first integrated circuit die to the second integrated circuit die, the first routing die being free of active and passive devices, the first routing die comprising first metallization patterns in one or more dielectric layers, the first metallization patterns having a line width in a range from 0.03 µm to 12 µm and a spacing in a range from 0.03 µm to 12 µm;
    a second routing die bonded to the first integrated circuit die and the second integrated circuit die, the second routing die having a front-side and a back-side, the front-side of the second routing die comprising die connectors, the die connectors of the second routing die being bonded to the active sides of the first integrated circuit die and the second integrated circuit die, the second routing die electrically coupling the first integrated circuit die to the second integrated circuit die, the second routing die being adjacent the first routing die, the second routing die being free of active and passive devices, the second routing die having a different number of die connectors than the first routing die, the die connectors on the second routing die being a different size in a plan view than the die connectors on the first routing die in a plan view;
    an encapsulant encapsulating the first integrated circuit die, the second integrated circuit die, and the first and second routing dies; and
    a first redistribution structure on and electrically connected to the die connectors of the first integrated circuit die and the second integrated circuit die, the first and second routing dies being between the first redistribution structure and the first integrated circuit die and the second integrated circuit die, the first redistribution structure comprising second metallization patterns in one or more dielectric layers, the second metallization patterns having a line width in a range from 2 µm to 15 µm and a spacing in a range from 2 µm to 15 µm.

2. The package of claim 1, wherein the first package structure further includes:

a first through via adjacent the first integrated circuit die, the first through via extending through the encapsulant.

3. The package of claim 2 further comprising:
a second package structure bonded to the first through via by way of a first set of conductive connectors.

4. The package of claim 3, wherein the first package structure further comprises:
a second redistribution structure over and electrically connected to the first through via, the second redistribution structure being between the first integrated circuit die and the second package structure.

5. The package of claim 3 further comprising
a package substrate bonded to the first redistribution structure of the first package structure by way of a second set of conductive connectors.

6. The package of claim 3, wherein the second package structure comprises a third integrated circuit die, the third integrated circuit die being electrically coupled to the first integrated circuit die by the first through via and the first redistribution structure.

7. The package of claim 1, wherein the encapsulant extends between the first routing die and the first integrated circuit die and the second integrated circuit die, the encapsulant surrounding the die connectors of the first routing die.

8. The package of claim 1, wherein the encapsulant extends between the first routing die and the first redistribution structure.

9. The package of claim 1, wherein the first routing die comprises:
a substrate; and
an interconnect structure on the substrate, the interconnect structure comprising the first metallization patterns in one or more dielectric layers, the die connectors of the first routing die being electrically coupled to the first metallization patterns of the interconnect structure.

10. The package of claim 9, wherein the first routing die further comprises a through via extending through the substrate, the through via being physically and electrically connected to the first redistribution structure, a first surface of the encapsulant physically contacting the one or more dielectric layers of the first redistribution structure, the first surface of the encapsulant being coplanar with a second surface of the substrate of the first routing die, the second surface of the substrate of the first routing die physically contacting the one or more dielectric layers of the first redistribution structure.

11. A method comprising:
forming a first package comprising:
forming an electrical connector over a carrier substrate;
attaching a back-side of a first die to the carrier substrate using an adhesive layer, the first die being adjacent the electrical connector;
attaching a back-side of a second die to the carrier substrate using an adhesive layer, the second die being adjacent the first die;
bonding a first routing die to active sides of the first and second dies using die connectors on the first routing die, the first routing die electrically coupling the first and second dies, the first routing die being free of active and passive devices, the electrical connector having a surface farther from a top surface of the carrier substrate than any surface of the first routing die is from the top surface of the carrier substrate;
bonding a second routing die to active sides of the first and second dies using die connectors on the second routing die, the second routing die electrically coupling the first and second dies, the second routing die being adjacent the first routing die, the second routing die being free of active and passive devices, the second routing die having a different number of die connectors than the first routing die, the die connectors on the second routing die being a different size in a plan view than the die connectors on the first routing die in a plan view;
encapsulating the first die, the second die, the first routing die, the second routing die, and the electrical connector with a molding compound;
forming a first redistribution structure over the first die, the second die, the first routing die, the second routing die, the molding compound, and the electrical connector; and
removing the carrier substrate; and
bonding a second package to the first package using a first set of conductive connectors, the second package being proximate the back-sides of the first die and the second die.

12. The method of claim 11 further comprising:
forming a second redistribution structure over the back-sides of the first die and the second die and over a first end of the electrical connector, the second redistribution structure being electrically connected to the electrical connector, the second package being bonded to the second redistribution structure.

13. The method of claim 11, wherein the molding compound extends between the routing die and the first die and the second die, the molding compound surrounding the die connectors of the routing die.

14. The method of claim 11, wherein the molding compound extends between the routing die and the first redistribution structure.

15. The method of claim 11 further comprising:
planarizing the molding compound, die connectors on active sides of the first die and the second die, and the electrical connector to have level surfaces.

16. The method of claim 11, wherein the routing die comprises:
a substrate;
an interconnect structure on the substrate, the interconnect structure comprising metallization patterns in one or more dielectric layers; and
a through via extending through the substrate, the through via being physically and electrically connected to the first redistribution structure, the die connectors of the routing die being electrically coupled to the metallization patterns of the interconnect structure.

17. A method comprising:
forming a first die comprising an active side and a back-side, wherein forming the first die comprises:
forming a first set and a second set of die connectors on the active side of the first die the first set of die connectors being shorter than the second set of die connectors;
forming a first package comprising:
forming an electrical connector over a carrier substrate;
adhering the first die to the carrier substrate, the active side being opposite a backside, the first die being adjacent the electrical connector;
adhering a second die to the carrier substrate, an active side of the second die comprising a third set and a fourth set of die connectors, the third set of die connectors being shorter than the fourth set of die connectors, the active side being opposite a backside, the second die being adjacent the first die;

bonding a routing die to the first and second dies using the first and third sets of die connectors, wherein the routing die comprises a substrate, through vias extending through the substrate, and an interconnect structure on the substrate and the through vias, the interconnect structure comprising first metallization patterns in one or more dielectric layers, the first metallization patterns being electrically coupled to the through vias, die connectors of the first routing die being electrically coupled to the first metallization patterns of the interconnect structure, the routing die being free of active and passive devices, wherein after bonding the routing die, the electrical connector has a surface farther from a top surface of the carrier substrate than any surface of the routing die is from the top surface of the carrier substrate;

encapsulating the first die, the second die, the routing die, and the electrical connector with a molding compound;

forming a redistribution structure overlying the active side of the first die, the molding compound, and the electrical connector, the redistribution structure comprising second metallization patterns in one or more dielectric layers, the second metallization patterns of the redistribution structure being electrically coupled to the second and fourth sets of die connectors and the electrical connector, the through vias of the routing die being physically and electrically connected to the first redistribution structure, a first surface of the molding compound physically contacting the one or more dielectric layers of the redistribution structure, the first surface of the molding compound being coplanar with a second surface of the substrate of the routing die, the second surface of the substrate of the routing die physically contacting the one or more dielectric layers of the redistribution structure; and removing the carrier substrate; and bonding a second package to the first package using a first set of conductive connectors, the second package being proximate a back-side of the first and second dies.

18. The method of claim 17, wherein the second and fourth sets of die connectors of the first and second dies are adjacent the routing die and extend from a front-side of the routing die to the back-side of the routing die.

19. The method of claim 17, wherein die connectors of the second and fourth sets of die connectors have a first height, and wherein the routing die has a second height, the first height being greater than the second height.

20. The method of claim 17, wherein the second package structure comprises a third die, the third die being electrically coupled to the first die by the electrical connector and the redistribution structure.

* * * * *